(12) United States Patent
Kwon et al.

(10) Patent No.: US 10,499,476 B2
(45) Date of Patent: Dec. 3, 2019

(54) DISPLAY DEVICE HAVING AN INSERTION MEMBER IN A DISPLAY PANEL

(71) Applicant: Samsung Display Co., Ltd., Yongin-si, Gyeonggi-do (KR)

(72) Inventors: Oh June Kwon, Hwaseong-si (KR); Seung Yong Song, Suwon-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 15/703,741

(22) Filed: Sep. 13, 2017

(65) Prior Publication Data

US 2018/0124898 A1     May 3, 2018

(30) Foreign Application Priority Data

Oct. 28, 2016  (KR) .................. 10-2016-0141994

(51) Int. Cl.
| | | |
|---|---|---|
| *H05B 33/08* | (2006.01) | |
| *H01L 27/32* | (2006.01) | |
| *G02F 1/1333* | (2006.01) | |
| *G02F 1/1335* | (2006.01) | |

(52) U.S. Cl.
CPC ... *H05B 33/0896* (2013.01); *G02F 1/133308* (2013.01); *G02F 1/133528* (2013.01); *H01L 27/3223* (2013.01)

(58) Field of Classification Search
CPC ........... H05B 33/0896; G02F 1/133308; G02F 1/133528; H01L 27/3223; H04N 5/2254; H04N 5/2257; G02B 7/09; G03B 17/28; G03B 17/26
See application file for complete search history.

(56) References Cited

U.S. PATENT DOCUMENTS

| | | | | |
|---|---|---|---|---|
| 8,415,872 | B2 | 4/2013 | Choi et al. | |
| 9,851,605 | B2* | 12/2017 | Watanabe | G02F 1/1339 |
| 2009/0051636 | A1* | 2/2009 | Natori | G09G 3/3648 345/87 |
| 2009/0115891 | A1* | 5/2009 | Ryu | H04N 5/2253 348/374 |
| 2011/0285934 | A1* | 11/2011 | Watanabe | G02F 1/133526 349/58 |
| 2014/0168864 | A1* | 6/2014 | Lin | G02F 1/133308 361/679.01 |
| 2016/0011633 | A1* | 1/2016 | Watanabe | G02F 1/1333 345/184 |
| 2018/0007817 | A1* | 1/2018 | Ryu | G06F 1/1626 |

FOREIGN PATENT DOCUMENTS

| | | |
|---|---|---|
| JP | 2003-255850 A | 9/2003 |
| KR | 10-2010-0113196 A | 10/2010 |
| KR | 10-2016-0053001 A | 5/2016 |
| KR | 10-2016-0095277 A | 8/2016 |
| KR | 10-2016-0096760 A | 8/2016 |

* cited by examiner

*Primary Examiner* — Tracie Y Green
(74) *Attorney, Agent, or Firm* — Lewis Roca Rothgerber Christie LLP

(57) ABSTRACT

A display device includes a display panel including a display area where a plurality of pixels are disposed and a non-display area where no pixel is disposed, the display panel having at least one through-hole disposed in the non-display area and penetrating the display panel, and an insertion member disposed in the through-hole and having a hollow space therein.

20 Claims, 16 Drawing Sheets

DISPLAY DEVICE HAVING AN INSERTION MEMBER IN A DISPLAY PANEL

CROSS-REFERENCE TO RELATED APPLICATION

This application claims priority to and the benefit of Korean Patent Application No. 10-2016-0141994, filed in the Korean Intellectual Property Office on Oct. 28, 2016, the entire content of which is incorporated herein by reference.

BACKGROUND

1. Field

Aspects of the present disclosure relate to a display device.

2. Description of the Related Art

Examples of display devices, which are currently known, include a liquid crystal display (LCD), a plasma display panel (PDP), an organic light emitting diode (OLED) device, a field effect display (FED), an electrophoretic display device, and the like.

Particularly, the OLED device includes two electrodes and an organic emission layer positioned therebetween. An electron injected from one electrode and a hole injected from the other electrode are combined with each other in the organic emission layer to generate an exciton, and the exciton emits energy to emit light.

Because the OLED device has a self-luminance characteristic and does not require a separate light source, unlike the LCD, thickness and weight thereof may be reduced. Further, because the OLED device has high-grade characteristics such as low power consumption, high luminance, and a high response speed, the OLED device receives attention as a next-generation display device.

Recent display devices have been required to have a wider display area and a smaller bezel region serving as a non-display area.

The above information disclosed in this Background section is for enhancement of understanding of the background of the invention and therefore it may contain information that does not form the prior art that is already known in this country to a person of ordinary skill in the art.

SUMMARY

Aspects of embodiments of the present disclosure are directed to a display device having a reduced or minimized bezel area that is provided outside a display area.

According to some embodiments of the present disclosure, there is provided a display device including: a display panel including a display area where a plurality of pixels are disposed and a non-display area where no pixel is disposed, the display panel having at least one through-hole disposed in the non-display area and penetrating the display panel; and an insertion member disposed in the through-hole and having a hollow space therein.

In an embodiment, the display area surrounds the non-display area.

In an embodiment, the insertion member includes: a main body disposed in the through-hole; and protrusions coupled to opposite ends of the main body and protruding from an upper surface and a lower surface of the display panel.

In an embodiment, the protrusion has a width that is larger than a minimum width of the through-hole.

In an embodiment, an outer surface of the main body is attached to an inner surface of the through-hole, which faces the outer surface of the main body.

In an embodiment, the display device further includes a first sealing member covering at least a part of the protrusion and at least a part of upper and lower surfaces of the display panel, which are adjacent to the protrusions.

In an embodiment, the display device further includes a second sealing member between an outer surface of the main body and an inner surface of the through-hole facing the outer surface of the main body.

In an embodiment, the main body includes a first tubular portion and a second tubular portion configured to be screw-coupled with the first tubular portion.

In an embodiment, the insertion member has a tubular shape.

In an embodiment, the insertion member has a circular cross-section.

In an embodiment, the insertion member has a quadrangular cross-section.

In an embodiment, the insertion member includes a metal.

In an embodiment, the metal includes copper and/or aluminum.

In an embodiment, the through-hole has a circular cross-section.

In an embodiment, the through-hole has a quadrangular cross-section.

In an embodiment, the display device further includes a camera configured to be positioned within the insertion member.

In an embodiment, the display device further includes a speaker configured to be positioned within the insertion member.

In an embodiment, the display device further includes a window on the display panel.

DETAILED DESCRIPTION

Figure 1:
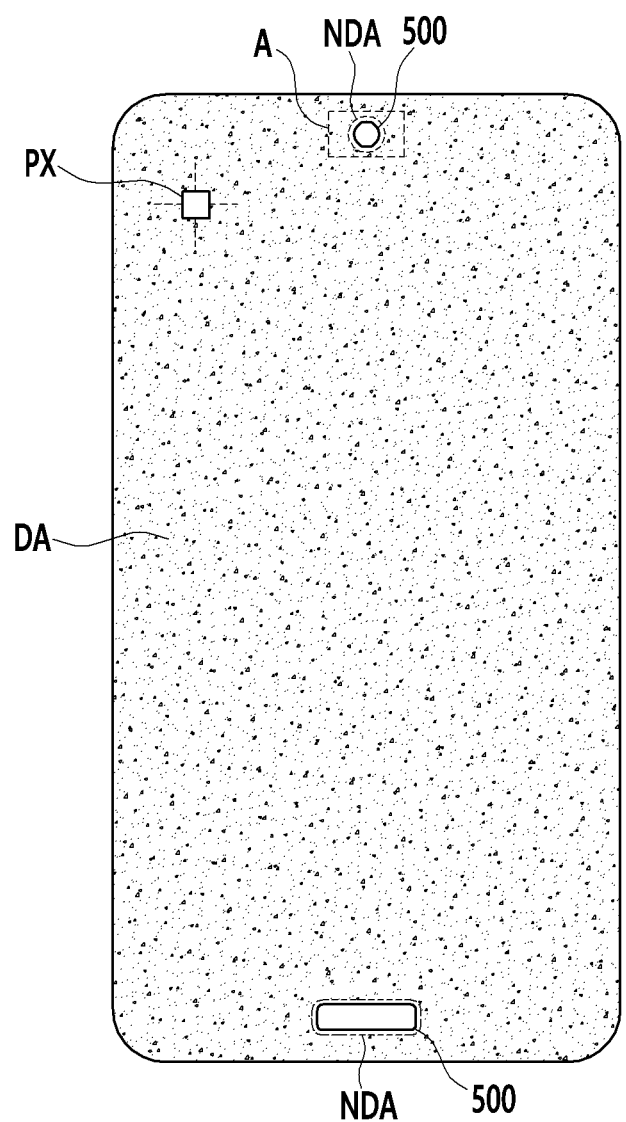
FIG. 1 is a schematic top plan view of a display device according to an exemplary embodiment of the present disclosure.

The present invention will be described more fully hereinafter with reference to the accompanying drawings, in which exemplary embodiments of the invention are shown. As those skilled in the art would realize, the described embodiments may be modified in various different ways, all without departing from the spirit or scope of the present disclosure. The drawings and description are to be regarded as illustrative in nature and not restrictive. Like reference numerals designate like elements throughout the specification.

In addition, the size and thickness of each configuration shown in the drawings are arbitrarily shown for better understanding and ease of description, but the present invention is not limited thereto.

In the drawings, the thickness of layers, films, panels, regions, etc., are exaggerated for clarity.

Hereinafter, a display device according to an exemplary embodiment will be described with reference to FIG. 1 to FIG. 3.

FIG. 1 is a schematic top plan view of a display device according to an exemplary embodiment; FIG. 2 is an enlarged view of the region A of FIG. 1; and FIG. 3 is a cross-sectional view of FIG. 2, taken along the line B-B'.

Figure 2:
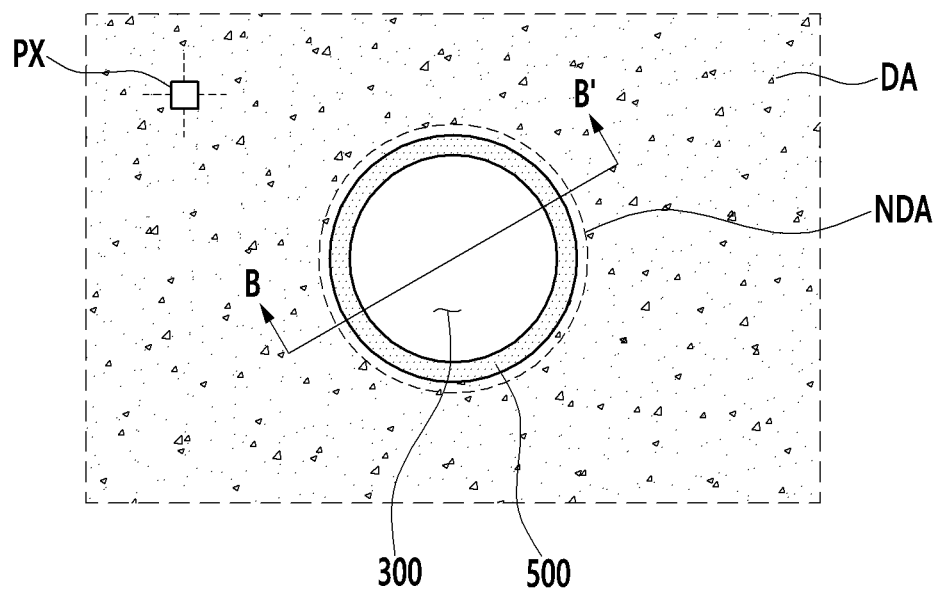
FIG. 2 is an enlarged view of the region A in FIG. 1.
Figure 3:
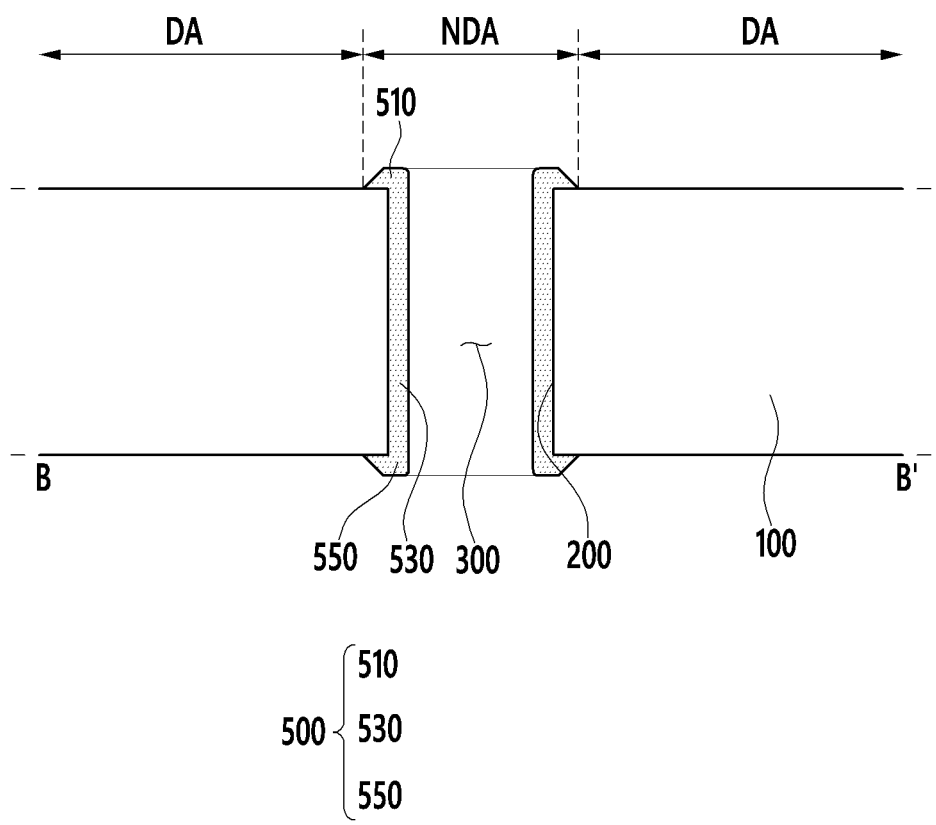
FIG. 3 is a cross-sectional view of FIG. 2, taken along the line B-B'.

Referring to FIG. 1 to FIG. 3, a display device 10 according to the present exemplary embodiment may include a display panel 100 having a through-hole (e.g., an opening) 200 therethrough, and an insertion member 500. The display panel 100 of the present exemplary embodiment includes a display area DA where a plurality of pixels are disposed and a non-display area NDA where no pixel is disposed, and the display area DA may surround (e.g., completely encompass or enclose) the non-display area NDA. The through-hole 200 that penetrates the display panel 100 is disposed on the non-display area NDA, and the insertion member 500 having a hollow space (e.g., an opening) 300 may be disposed in the through-hole 200. A camera module 900 (e.g., refer to FIG. 15) may be provided in the hollow space 300 of the insertion member 500, and thus the plurality of pixels PX may surround (e.g., completely encompass or enclose) the periphery of the camera module (e.g., camera) 900 that is disposed in the display device 10 in a plan view.

The display panel 100, which displays images, includes a substrate, an emission layer, an encapsulation layer, and a polarizer. Here, the display panel 100 may illustrate portions of the display device 10 (e.g., refer to FIG. 1), other than the window 600 (e.g., refer to FIG. 15).

In a plan view, the display panel 100 may be divided into the display area DA and the non-display area NDA. The plurality of pixels PX is provided in the display area DA such that the display area DA can display an image. On the other hand, because no pixel is provided in the non-display area NDA, the non-display area NDA cannot display an image. Here, the pixel PX implies a minimum or smallest unit that can emit light of one color, and for example, the pixels PX may include a red pixel that can display a color of red, a green pixel that can display a color of green, and a blue pixel that can display a color of blue.

In this case, the pixels PX disposed in the display area DA may include an organic light emitting element, a liquid crystal display element, an electrophoretic display element, and/or the like.

Referring to FIG. 1 to FIG. 3, the display area DA may be disposed in the entire surface of the display device 10, that is, from the top to the bottom (e.g., from the top edge to the bottom edge of the display, which may represent the two short edges of the display device from an above plane view). In addition, the non-display area NDA may be disposed in a part of top and bottom portions of the display device 10. That is, the display area DA may surround the non-display area NDA in the upper and lower portions of the display device 10. In FIG. 1, the non-display area NDA is provided in the two portions, that is, the top portion and the bottom portion of the display device 10; however, embodiments of the present disclosure are not limited thereto. For example, the non-display area NDA may be disposed in one of the two portions.

As described, the display area DA may be disposed around the non-display area NDA in the display device 10 according to the present exemplary embodiment. That is, the non-display area NDA that does not display an image may be disposed in the display area DA. In this case, the camera module 900 and/or the like may be disposed in the non-display area NDA. In the present exemplary embodiment, a bezel area of the display device 10 can be reduced or minimized while arranging the camera module 900 and/or the like. The bezel is an area that is disposed between the display area DA and an edge of the display area DA, and is also referred to as a dead space where no pixel is arranged.

In the present exemplary embodiment, the display device 10 may be implemented as a bezel-less display device while including a non-display area NDA for installation of an additional module such as a camera module. In this case, the term, "bezel-less" may imply that no bezel or outside frame exists in the display device 10 or that the bezel is partly present but cannot be readily recognized when viewed from the outside.

In the present exemplary embodiment, the non-display area NDA may include a through-hole 200 (e.g., refer to FIG. 8) that penetrates the display panel 100. The through-hole 200 may be formed by removing at least a part of the display panel 100 in the non-display area NDA. For example, the through-hole 200 may be formed by wholly removing the display panel 100 in the non-display area NDA or partially removing the display panel 100 in the non-display area NDA. When the through-hole 200 is formed by wholly removing the display panel 100 in the non-display area NDA, a cross-sectional area of the non-display area NDA is substantially the same as that of the through-hole 200, and when the through-hole 200 is formed by partially removing the display panel 100 in the non-display area NDA, the cross-sectional area of the non-display area NDA may be larger than that of the through-hole 200.

In an embodiment, the through-hole 200 may have a circular cross-section. When the display panel 100 is viewed in a plan view, the through-hole 200 may have a circular shape.

The removed portion of the display panel 100 may include a substrate, an insulation layer, an encapsulation layer, a polarizer, and the like. However, signal wires or power wires that are used for driving pixels PX are not included in the removed portion of the display panel 100. That is, constituent elements that do not affect driving of the pixels PX can be removed.

In this case, the through-hole 200 may be formed by a drill, a punching tool, a laser, and/or the like. After the display panel 100 where the display area DA and the non-display area NDA are formed is manufactured, at least a part of the non-display area NDA is removed by using a drill and/or the like such that the through-hole 200 can be formed.

In the present exemplary embodiment, the insertion member 500 may be disposed in the through-hole 200. The hollow space 300 may be provided in the insertion member 500. The insertion member 500 may have a tubular shape having the hollow space 300 therein.

The insertion member 500 may include a metal such as copper or aluminum. However, the type of metal included in the insertion member 500 is not limited thereto, and various suitable soft metals may be applicable.

The insertion member 500 may have a circular cross-section corresponding to the shape of the through-hole 200. As described, the insertion member 500 has the circular cross-section such that the insertion member 500 can be closely attached to (e.g., contacting) the through-hole 200.

Figure 4:
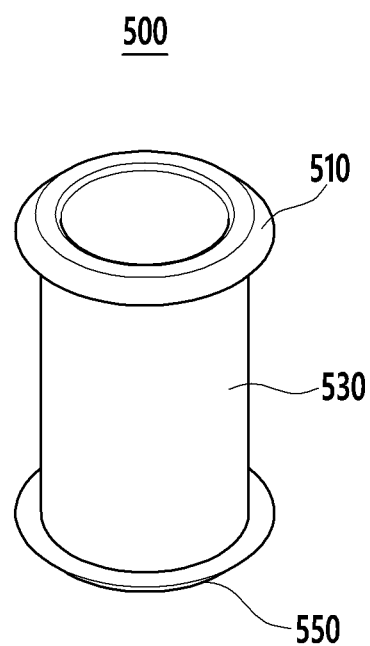
FIG. 4 shows an insertion member that is in a state of being inserted into a through-hole of FIG. 3.
Figure 5:
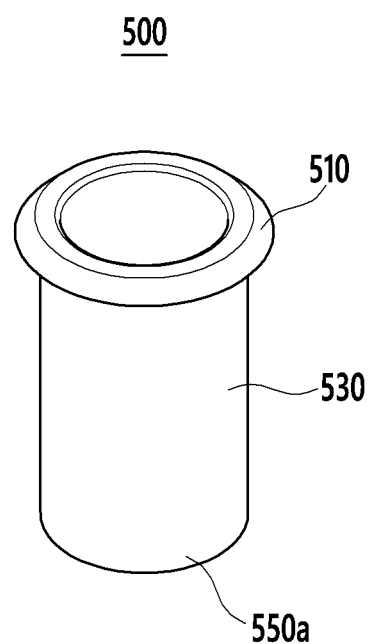
FIG. 5 shows the insertion member before being inserted into the through-hole of FIG. 3.

Referring to FIG. 4 and FIG. 5, the insertion member 500 of the display device 10 according to the present exemplary embodiment will be described. FIG. 4 shows the insertion member fixed into the through-hole of FIG. 3, and FIG. 5 shows the insertion member before being fixed into the through-hole of FIG. 3.

Referring to FIG. 4, the insertion member 500 may include a main body 530 and protrusions 510 and 550. The main body 530 is disposed in the through-hole 200, and an outer surface of the main body 530 and an inner surface of the through-hole 200, which face each other, may be closely attached to each other. Accordingly, the main body 530 supports the inner side of the through-hole 200.

The protrusions 510 and 550 include a first protrusion 510 and a second protrusion 550. The first protrusion 510 and the second protrusion 550 are coupled to opposite ends of the main body 530, respectively, such that they may protrude from an upper surface and a lower surface of the display panel 100. For example, the first protrusion 510 may protrude from the upper surface of the display panel 100 and the second protrusion 550 may protrude from the lower surface of the display panel 100.

In this case, the protrusions 510 and 550 may have a larger exterior diameter than the diameter of the through-hole 200. The exterior diameter of the protrusions 510 and 550 is set to be larger than the diameter of the through-hole 200, because if an exterior diameter of at least one of the first protrusion 510 and the second protrusion 550 is smaller than the diameter of the through-hole 200, the main body 530 disposed in the through-hole 200 may be separated from the display panel 100. Thus, the exterior diameter of the protrusions 510 and 550 is set to be greater than the diameter of the through-hole 200 so as to fix the main body 530 in the through-hole 200.

In addition, when the exterior diameter of the pair of protrusions 510 and 550 is set to be greater than the diameter of the through-hole 200, the protrusions 510 and 550 can concurrently (e.g., simultaneously) press the upper surface and the lower surface of the display panel 100. The first protrusion 510 may press the upper surface of the display panel 100 and the second protrusion 550 may press the lower surface of the display panel 100.

As described, the pair of protrusions 510 and 550 concurrently (e.g., simultaneously) press the upper surface and the lower surface of the display panel 100 so that a plurality of layers that form the display panel 100 can be prevented or substantially prevented from being lifted (e.g., separated) from each other. When the through-hole 200 is formed by partially removing the display panel 100, the plurality of layers disposed in the through-hole 200 may be lifted from each other. However, in the present exemplary embodiment, when the upper surface and the lower surface of the display panel 100 are concurrently (e.g., simultaneously) pressed by the pair of protrusions 510 and 550, the plurality of layers can be tightly attached to each other. Accordingly, external oxygen, moisture, and/or the like can be prevented or substantially prevented from penetrating into the plurality of layers in the through-hole 200.

Referring to FIG. 4, the insertion member 500 may have a rivet shape. However, the insertion member 500 of the present exemplary embodiment may have any suitable shape in which the head portions of both sides, that is, a pair of protrusions 510 and 550, are open. The insertion member 500 may have a tubular shape of which both ends are opened in the vertical direction.

FIG. 5 shows the insertion member before being fixed into the through-hole 200. Referring to FIG. 5, before being fixed into the through-hole 200, the pair of protrusions 510 and 550 of the insertion member 500 may have different shapes. In this case, the exterior diameter of the first protrusion 510 is set to be larger than the diameter of the through-hole 200, but a diameter of a lower end portion 550a at which the second protrusion 550 is disposed may be formed to be the same as the diameter of the main body 530. Next, the insertion member 500 of FIG. 5 is inserted into the through-hole 200, and then the end portion 550a of the insertion member 500 is formed or processed to form the second protrusion 550 having an exterior diameter than is larger than the diameter of the through-hole 200.

The process of inserting and fixing the insertion member 500 of FIG. 4 into the through-hole 200 of the display panel 100 will be described in more detail with reference to FIG. 6 to FIG. 9.

FIG. 6 to FIG. 9 show a process of installation of an insertion member in a through-hole of a display device.

Figure 6:
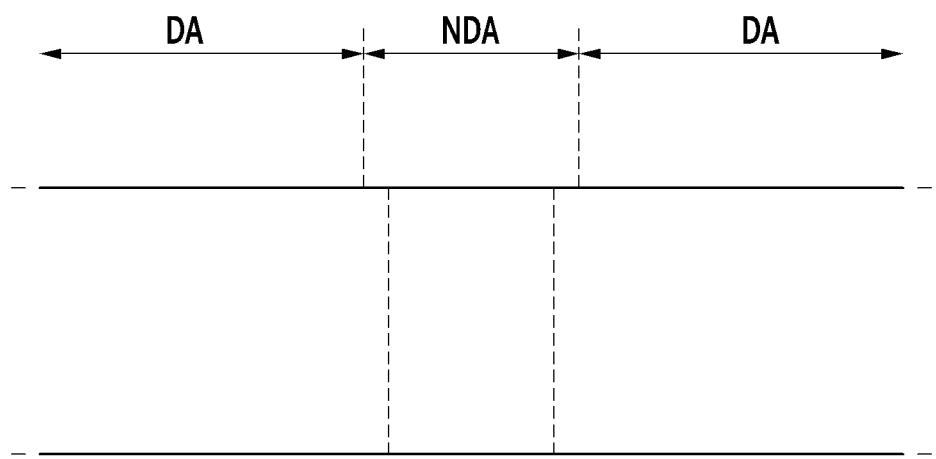
FIGS. 6-9 show a process of installing the insertion member into the through-hole of the display device, according to an exemplary embodiment of the present disclosure.
Figure 7:
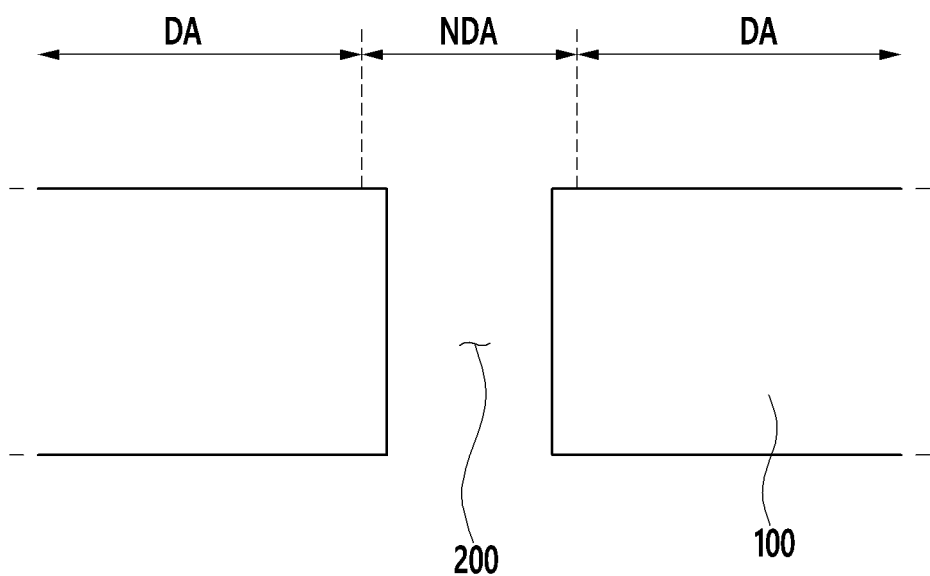

Referring to FIG. 6 and FIG. 7, the through-hole 200 is formed in the non-display area NDA. The through-hole 200 is formed by removing the display panel 100 in the non-display area NDA. As described above, the through-hole 200 that penetrates the display panel 100 may be formed by removing the display panel 100 in the non-display area NDA using a drill, a punching tool, a laser, and/or the like. In this case, the through-hole 200 may have a circular shape when viewed in a plan view.

Figure 8:
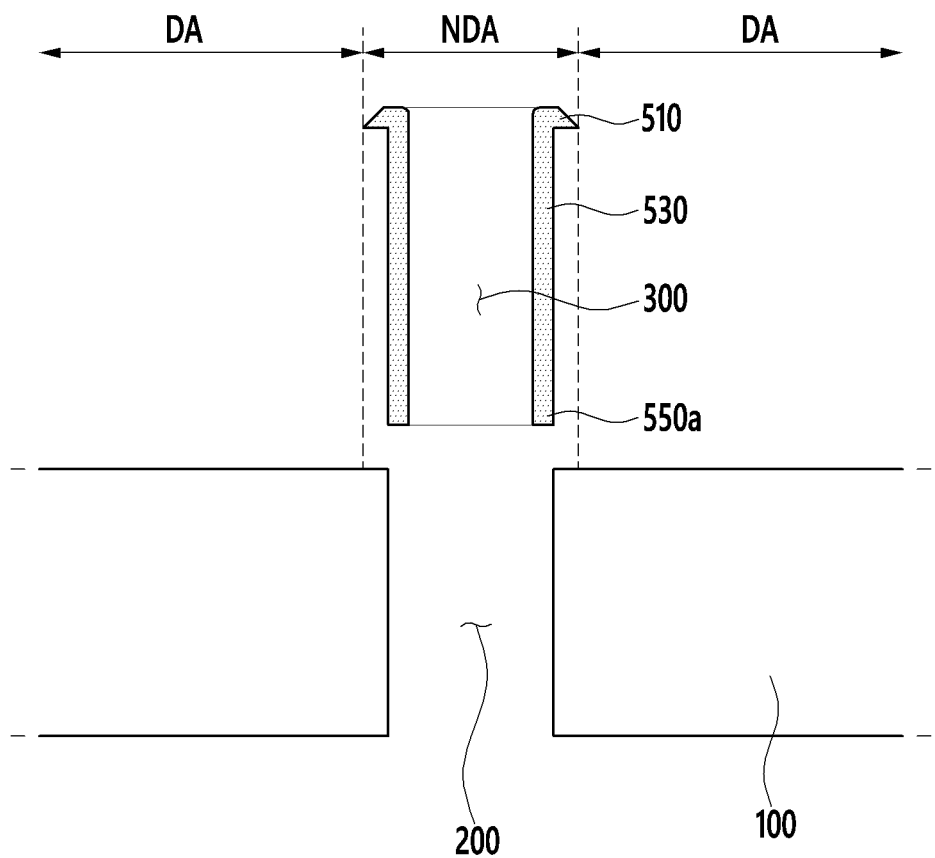
Figure 9:
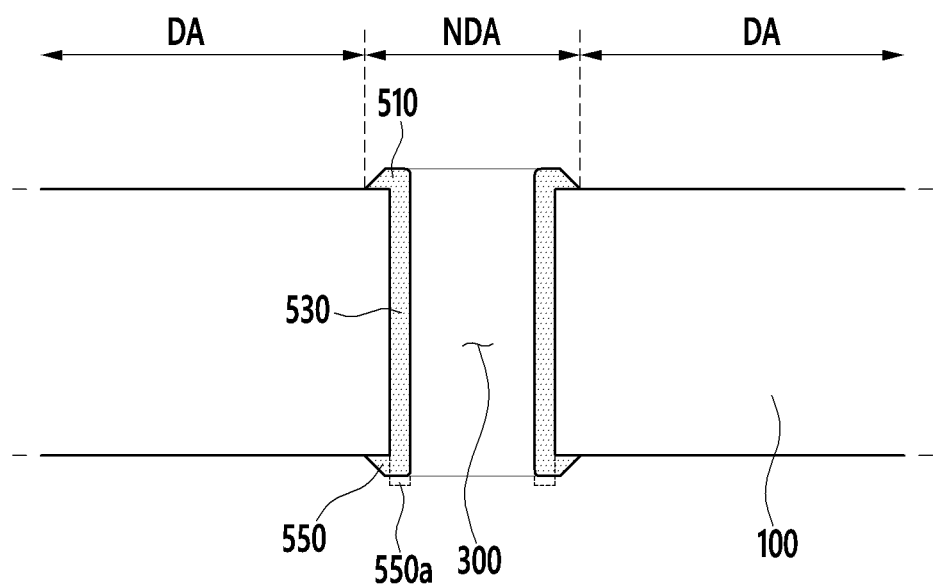

Next, as shown in FIG. 8 and FIG. 9, the insertion member 500 is inserted into the through-hole 200. In this case, the insertion member 500 inserted into the through-hole 200 may be the same insertion member 500 of FIG. 5. That is, an exterior diameter of a first protrusion 510 that is coupled to an upper end of a main body 530 is larger than the diameter of the through-hole 200, but a lower end portion 550a of the main body 530 may have a diameter that is the same as the diameter of the main body 530.

While the first protrusion 510 is closely attached to the upper surface of the display panel 100, an external force is applied to the lower end portion 550a so as to form a second protrusion 550. The second protrusion 550 may have a shape that is the same as that of the first protrusion 510. Accordingly, the second protrusion 550 can be closely attached to the lower surface of the display panel 100. That is, the second protrusion 550 may be formed to have the same shape as the insertion member 500 of FIG. 4.

Next, an exemplary variation of the insertion member 500 of the display device according to the present exemplary embodiment will be described with reference to FIG. 10.

Figure 10:
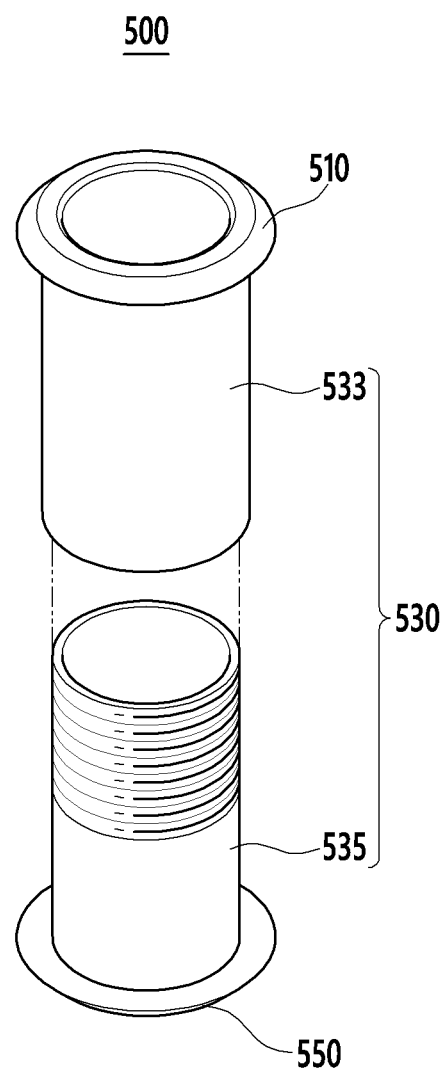
FIG. 10 is an exemplary variation of the insertion member of FIG. 5 according to an exemplary embodiment of the present disclosure.

Referring to FIG. 10, a main body 530 of an insertion member 500 may include a first tubular portion 533 and a second tubular portion 535 that are separated from each other. Unlike the integrally formed main body 530 of FIG. 4, the main body 530 of FIG. 10 may not have an integral body.

The first tubular portion 533 and the second tubular portion 535 may be screw-coupled to each other. When the first tubular portion 533 and the second tubular portion 535 are screw-coupled, the main body 530 of FIG. 10 may have the same shape as the main body 530 of FIG. 4. In this case, the first tubular portion 533 and the second tubular portion 535 may both have a tubular shape.

When the insertion member 500 of FIG. 10 is inserted and fixed to the through-hole 200 of FIG. 7, the first tubular portion 533 and the second tubular portion 535 are respectively inserted into the through-hole 200 from different directions. For example, the first tubular portion 533 is inserted from an upper side to a lower side of the through-hole 200, and the second tubular portion 535 is inserted to the upper side from the lower side of the through-hole 200. Next, the first tubular portion 533 and the second tubular portion 535 are coupled to each other by rotating one of the first tubular portion 533 and the second tubular portion 535 in one direction. Accordingly, the first tubular portion 533 and the second tubular portion 535 may have the same shape as the main body 530 of FIG. 4.

Figure 11:
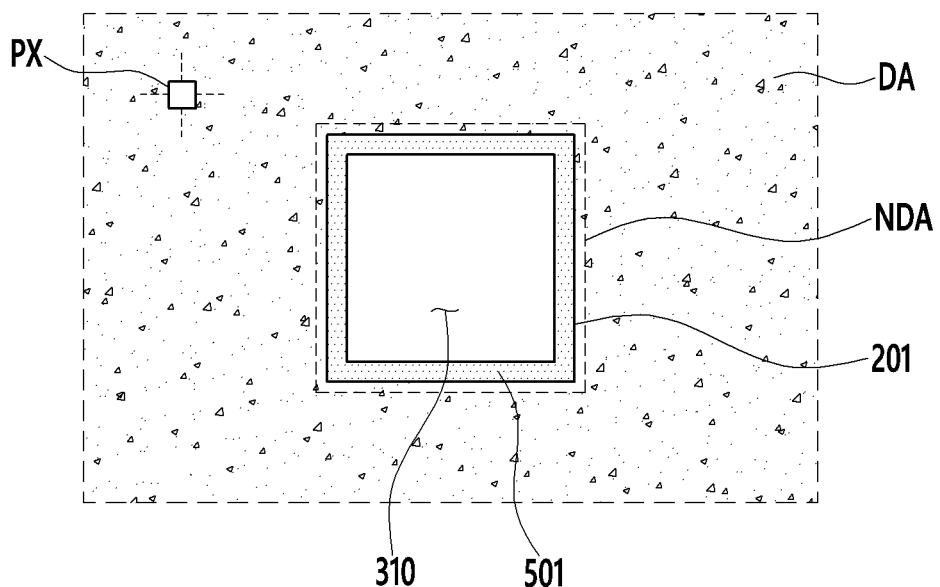
FIG. 11 shows an exemplary variation of the through-hole of FIG. 2.
Figure 12:
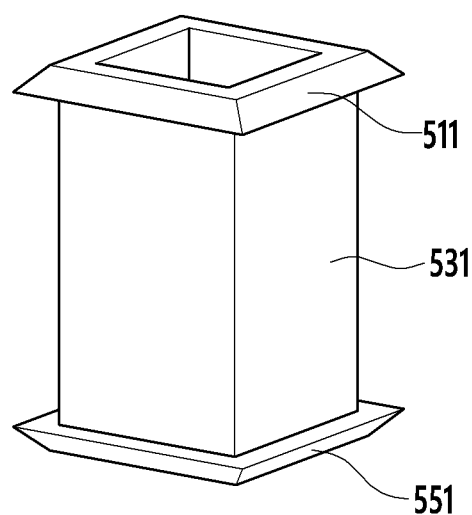
FIG. 12 shows an exemplary variation of the insertion member inserted and fixed into the through-hole of FIG. 11.

Referring to FIG. 11 and FIG. 12, an exemplary variation of the insertion member 500 of the display device according to the exemplary embodiment will be described.

Referring to FIG. 11, a through-hole (e.g., an opening) 201 may have a quadrangular cross-section. When the display panel 100 is viewed in a plan view, the through-hole 201 may have a quadrangular shape. However, embodiments of the present disclosure are not limited thereto, and the through-hole 201 may have any other suitable shape. For example, the through-hole 201 may have a polygonal shape such as a triangle, a pentagon, or the like.

In this case, as shown in FIG. 12, an insertion member 501 inserted into the through-hole 201 of FIG. 11 may have a quadrangular cross-section corresponding to the shape of the through-hole 201. As described, the insertion member 501 has a quadrangular cross-section so that the insertion member 501 can be closely attached to the through-hole 201.

In this case, protrusions 511 and 551 may have a greater width than the minimum width of the through-hole 201. To prevent or substantially prevent the protrusions 511 and 551 from penetrating the through-hole 201, the width of the protrusions 511 and 551 may be formed to be larger than the minimum width of the through-hole 201.

Next, an insertion member 500 of a display device according to another exemplary embodiment will be described with reference to FIG. 13.

Figure 13:
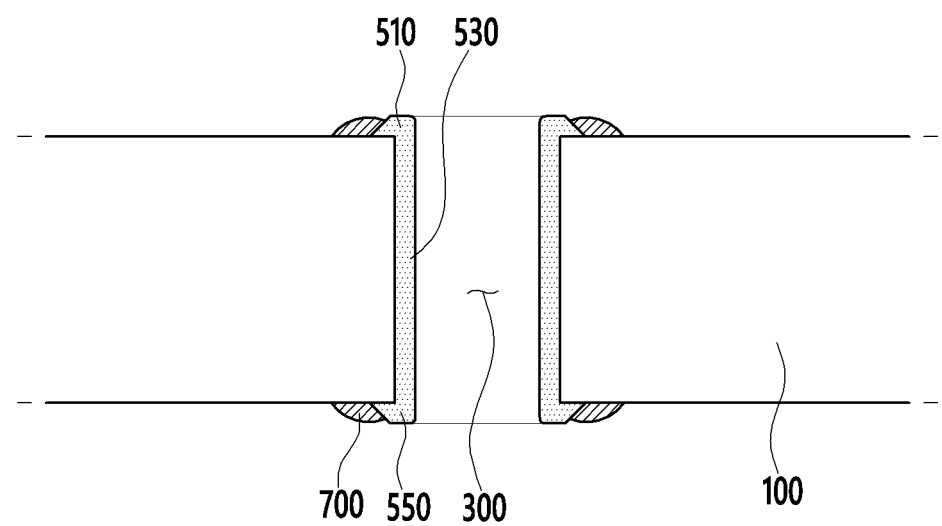
FIG. 13 shows a state in which a first sealing member is coupled to the insertion member of FIG. 3.

Referring to FIG. 13, a display device according to another exemplary embodiment further includes a first sealing member 700 that covers at least a part of protrusions 510 and 550.

The first sealing member 700 may not only cover the protrusions 510 and 550 but also cover upper and lower surfaces of a display panel 100, which are adjacent to the protrusions 510 and 550. Because the first sealing member 700 covers the protrusions 510 and 550 and the display panel 100, external oxygen, moisture, and/or the like can be prevented or substantially prevented from penetrating into the through-hole 200. That is, external oxygen, moisture, and/or the like can be prevented or substantially prevented from penetrating into a plurality of layers that are provided in the through-hole 200.

The first sealing member 700 may be made of a mixture of an inorganic sealant and an organic compound. In this case, the first sealing member 700 may be formed by dispensing or screen printing, for example.

The inorganic sealant may include $K_2O$, $Fe_2O_3$, $Sb_2O_3$, ZnO, $P_2O_6$, $V_2O_5$, $TiO_2$, $Al_2O_3$, $WO_3$, SnO, PbO, MgO, CaO, BaO, $Li_2O$, $Na_2O$, $B_2O_3$, $TeO_2$, $SiO_2$, $Ru_2O$, $Rb_2O$, $Rh_2O$, CuO, and/or $B_2O_3$.

The organic compound provides viscosity to the inorganic sealant as a solvent or a binder to facilitate the application of the first sealing member 700. The organic compound may include ethyl cellulose, nitrocellulose, and/or hydroxypropyl cellulose.

Next, an insertion member 500 of a display device according to another exemplary embodiment will be described with reference to FIG. 14.

Figure 14:
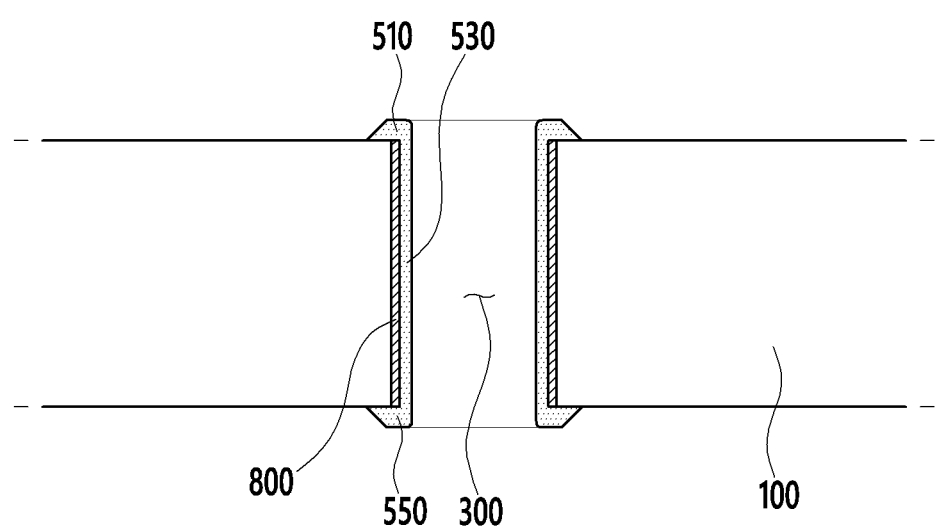
FIG. 14 shows a state in which a second sealing member is coupled to the insertion member of FIG. 3.

Referring to FIG. 14, a display device according to the present exemplary embodiment further includes a second sealing member 800 that is provided between a main body 530 of an insertion member 500 and a through-hole 200. The second sealing member 800 may be coated to an exterior surface of the main body 530 before the insertion member 500 is inserted into the through-hole 200. Next, as the main body 530 is inserted into the through-hole 200, the second sealing member 800 may be disposed between the main body 530 and the through-hole 200.

In an example, before the insertion member 500 is inserted into the through-hole 200, the second sealing member 800 may be coated to an inner surface of the through-hole 200. Next, as the main body 530 is inserted into the through-hole 200, the second sealing member 800 can be disposed between the main body 530 and the through-hole 200.

The second sealing member 800 may be formed of the same material as the first sealing member 700. That is, the second sealing member 800 may be made of a mixture of an inorganic sealant and an organic compound. The inorganic sealant may include $K_2O$, $Fe_2O_3$, $Sb_2O_3$, ZnO, $P_2O_6$, $V_2O_5$, $TiO_2$, $Al_2O_3$, $WO_3$, SnO, PbO, MgO, CaO, BaO, $Li_2O$, $Na_2O$, $B_2O_3$, $TeO_2$, $SiO_2$, $Ru_2O$, $Rb_2O$, $Rh_2O$, CuO, and/or $B_2O_3$.

The organic compound provides viscosity to the inorganic sealant as a solvent or a binder to facilitate the application of the second sealing member 800. The organic compound may include ethyl cellulose, nitrocellulose, and/or hydroxypropyl cellulose.

A state in which a camera module is installed in the insertion member of the display device according to the present exemplary embodiment will be described with reference to FIG. 15.

Figure 15:
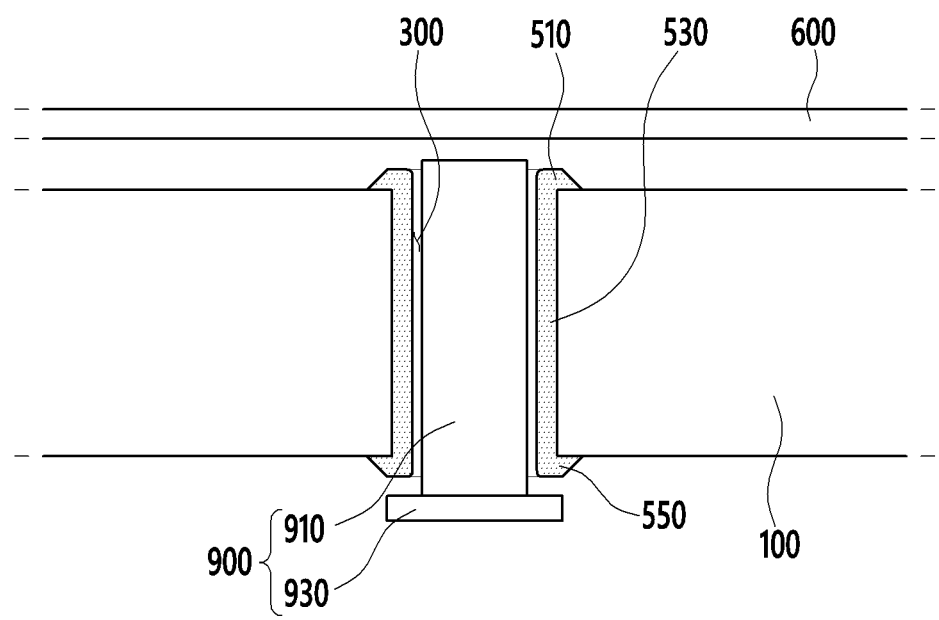
FIG. 15 shows a state in which a camera is installed in the insertion member of an exemplary embodiment of the present disclosure.

Referring to FIG. 15, a camera module 900 may be disposed in a hollow space 300 of the insertion member 500. The camera module 900 may include a camera lens 910 and an image sensor 930.

When the camera module 900 is disposed in the hollow space 300 of the insertion member 500, the display area DA may surround the periphery of the camera module 900 when viewed in a plan view. Accordingly, as described above, a display device 10 according to the present exemplary embodiment can be realized as a bezel-less display device where no bezel or outside frame is provided.

Next, a related art display device will be described with reference to FIG. 16.

Figure 16:
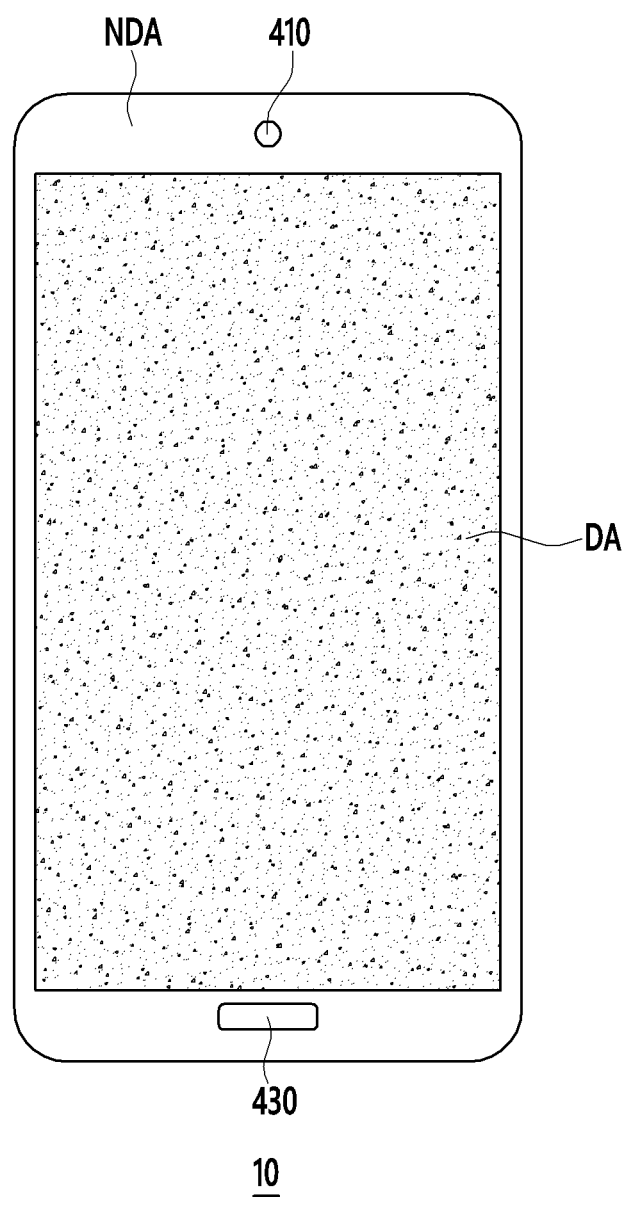
FIG. 16 shows a comparative example of a display device in which bezels are disposed in top and bottom portions thereof.

FIG. 16 shows a comparative example of a display device having a bezel or outside frame, wherein a camera module (e.g., a camera) 410 is provided in a top portion of a display device 10 and a home button 430 is provided in a bottom portion of the display device 10. As described, when the camera module 410 is provided in the top portion of the display device 10, a non-display area NDA where no pixel is disposed may be disposed in the periphery of the camera module 410. That is, as shown in FIG. 16, a bezel where no pixel is disposed may be formed in the top portion of the display device 10 so as to dispose the camera module 410 in the top portion of the display device 10. Similarly, when the home button 430 is disposed in the bottom portion of the display device 10, a bezel where no pixel is disposed may be formed in the bottom portion of the display device 10 surrounding the home button 430.

However, according to the present exemplary embodiment, as shown in FIG. 1, a through-hole 200 is provided in the non-display area NDA that is surrounded by a display area DA and the camera module 900 is provided in a hollow space 300 of an insertion member 500 that is disposed in the through-hole 200 such that a bezel-less device that does not have a bezel can be implemented.

In this case, not only the camera module 900 but also a speaker and the like may be provided in the hollow space 300 of the insertion member 500.

Meanwhile, referring back to FIG. 15, the display device according to the present exemplary embodiment may further include a window 600 that is provided on the display panel 100. The window 600 can protect the display panel 100. The window 600 can protect not only the display panel 100 but also the camera module 900 that is provided therebelow.

It will be understood that, although the terms "first", "second", "third", etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section discussed below could be termed a second element, component, region, layer or section, without departing from the spirit and scope of the inventive concept.

Spatially relative terms, such as "top," "bottom," "lower", "upper" and the like, may be used herein for ease of description to describe one element or feature's relationship to another element(s) or feature(s) as illustrated in the figures. It will be understood that the spatially relative terms are intended to encompass different orientations of the device in use or in operation, in addition to the orientation depicted in the figures. The device may be otherwise oriented (e.g., rotated 90 degrees or at other orientations) and the spatially relative descriptors used herein should be interpreted accordingly. In addition, it will also be understood that when a layer is referred to as being "between" two layers, it can be the only layer between the two layers, or one or more intervening layers may also be present.

The terminology used herein is for the purpose of describing particular embodiments and is not intended to be limiting of the inventive concept. As used herein, the singular forms "a" and "an" are intended to include the plural forms as well, unless the context clearly indicates otherwise. It will be further understood that the terms "include," "including," "comprises," and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list. Further, the use of "may" when describing embodiments of the inventive concept refers to "one or more embodiments of the inventive concept." Also, the term "exemplary" is intended to refer to an example or illustration.

It will be understood that when an element or layer is referred to as being "on", "connected to", "coupled to", or "adjacent" another element or layer, it can be directly on, connected to, coupled to, or adjacent the other element or layer, or one or more intervening elements or layers may be present. When an element or layer is referred to as being "directly on," "directly connected to", "directly coupled to", or "immediately adjacent" another element or layer, there are no intervening elements or layers present.

As used herein, the term "substantially," "about," and similar terms are used as terms of approximation and not as terms of degree, and are intended to account for the inherent variations in measured or calculated values that would be recognized by those of ordinary skill in the art.

As used herein, the terms "use," "using," and "used" may be considered synonymous with the terms "utilize," "utilizing," and "utilized," respectively.

While this invention has been described in connection with what is presently considered to be practical exemplary embodiments, it is to be understood that the invention is not limited to the disclosed embodiments, but, on the contrary, is intended to cover various suitable modifications and equivalent arrangements included within the spirit and scope of the appended claims, and equivalents thereof.

DESCRIPTION OF SOME OF THE SYMBOLS

DA: display area
NDA: non-display area
PX: pixel
10: display device
100: display panel
200: through-hole
300: hollow space
500: insertion member
510, 550: protrusion
530: main body
600: window
700: first sealing member
800: second sealing member
900: camera module

What is claimed is:

1. A display device comprising:
    a display panel comprising a display area where a plurality of pixels are disposed and a non-display area where no pixel is disposed, the display panel having at least one through-hole disposed in the non-display area and penetrating the display panel; and
    an insertion member fixed in the through-hole and having a hollow space therein, the insertion member comprising a main body in the through-hole and protrusions at opposite ends of the main body, wherein one of the protrusions contacts a part of an upper surface of the display panel and an other one of the protrusions contacts a part of a lower surface of the display panel.

2. The display device of claim 1, wherein the display area surrounds the non-display area.

3. The display device of claim 1, wherein the protrusions protrude from the upper surface and the lower surface of the display panel.

4. The display device of claim 3, wherein at least one of the protrusions has a width that is larger than a minimum width of the through-hole.

5. The display device of claim 3, wherein an outer surface of the main body is attached to an inner surface of the through-hole, which faces the outer surface of the main body.

6. The display device of claim 3, further comprising a first sealing member covering at least a part of the protrusions and at least a part of upper and lower surfaces of the display panel, which are adjacent to the protrusions.

7. The display device of claim 3, further comprising a second sealing member between an outer surface of the main body and an inner surface of the through-hole facing the outer surface of the main body.

8. The display device of claim 3, wherein the main body comprises a first tubular portion and a second tubular portion configured to be screw-coupled with the first tubular portion.

9. The display device of claim 1, wherein the insertion member has a tubular shape.

10. The display device of claim 9, wherein the insertion member has a circular cross-section.

11. The display device of claim 9, wherein the insertion member has a quadrangular cross-section.

12. The display device of claim 9, wherein the insertion member comprises a metal.

13. The display device of claim 12, wherein the metal comprises copper and/or aluminum.

14. The display device of claim 1, wherein the through-hole has a circular cross-section.

15. The display device of claim 1, wherein the through-hole has a quadrangular cross-section.

16. The display device of claim 1, further comprising a camera configured to be positioned within the insertion member.

17. The display device of claim 1, further comprising a speaker configured to be positioned within the insertion member.

18. The display device of claim 1, further comprising a window on the display panel.

19. A display device comprising:
   a display panel comprising a display area where a plurality of pixels are disposed and a non-display area where no pixels are disposed, the display panel having at least one through-hole disposed in the non-display area and penetrating the display panel; and
   a sealing member contacting at least a part of an inner circumferential surface of the through-hole and extending from one end to an other end of the display panel along a thickness direction of the display panel.

20. The display device of claim 19, further comprising an insertion member disposed in the through-hole and having a hollow space therein.

\* \* \* \* \*